United States Patent
Sakurai et al.

[11] Patent Number: 6,025,098
[45] Date of Patent: Feb. 15, 2000

[54] PHOTOSENSITIVE COMPOSITION AND PHOTOSENSITIVE RUBBER PLATE

[75] Inventors: Fusayoshi Sakurai, Yokohama; Haruo Ueno, Tokyo, both of Japan

[73] Assignee: Nippon Zeon Co., Ltd, Tokyo, Japan

[21] Appl. No.: 08/809,369

[22] PCT Filed: Sep. 25, 1995

[86] PCT No.: PCT/JP95/01923

§ 371 Date: Mar. 28, 1997

§ 102(e) Date: Mar. 28, 1997

[87] PCT Pub. No.: WO96/10218

PCT Pub. Date:Apr. 4, 1996

[30] Foreign Application Priority Data

Sep. 29, 1994 [JP] Japan .................................... 6-259158

[51] Int. Cl.⁷ ............................ G03F 7/033; G03F 7/038; G03F 7/11
[52] U.S. Cl. ..................... 430/18; 430/281.1; 430/286.1; 430/287.1; 430/306; 522/110
[58] Field of Search .............................. 430/286.1, 287.1, 430/306, 281.1, 18; 522/110

[56] References Cited

U.S. PATENT DOCUMENTS

| | | | |
|---|---|---|---|
| 5,250,389 | 10/1993 | Nakamura et al. | 430/281.1 |
| 5,344,744 | 9/1994 | Ueda et al. | 430/287.1 |
| 5,348,844 | 9/1994 | Wagner | 430/286.1 |
| 5,422,225 | 6/1995 | Southwick et al. | 430/270.1 |
| 5,679,485 | 10/1997 | Suzuki et al. | 430/18 |
| 5,863,704 | 1/1999 | Sakurai et al. | 430/271.1 |

FOREIGN PATENT DOCUMENTS

| | | |
|---|---|---|
| 0 474 178 A1 | 3/1991 | European Pat. Off. . |
| 0 675 412 A1 | 10/1994 | European Pat. Off. . |
| 59-100433 | 6/1984 | Japan . |
| 2-7055 | 1/1990 | Japan . |
| 4-271351 | 9/1992 | Japan . |
| 5-165216 | 7/1993 | Japan . |
| 5-232698 | 9/1993 | Japan . |
| 6-202331 | 7/1994 | Japan . |
| 1395822 | 5/1972 | United Kingdom . |
| 94-023342 | 10/1994 | WIPO .............................. G03F 7/027 |

*Primary Examiner*—Bernard Codd
*Attorney, Agent, or Firm*—Armstrong, Westerman, Hattori, McLeland & Naughton

[57] ABSTRACT

The present invention is intended to provide a photosensitive rubber plate which is superior in transparency and strength balance and high in rate of washing with water after light exposure, and a photosensitive composition used for obtaining the rubber plate. The photosensitive composition contains 20–65 parts by weight of a block copolymer having

- at least one polymer block A consisting of a polymer containing 95% by weight or more of an aromatic vinyl monomer unit and
- at least one polymer block B consisting of a conjugated diene polymer containing 20% by weight or more of a conjugated diene monomer unit and having a vinyl bond content in the conjugated diene monomer unit, of 15–70% by weight.

35–80 parts by weight of a hydrophilic copolymer, the total amount of the block copolymer and the hydrophilic copolymer being 100 parts by weight, 5–300 parts by weight of a photopolymerizable ethylenically unsaturated monomer, and 0.1–10 parts by weight of a photopolymerization initiator.

13 Claims, No Drawings

PHOTOSENSITIVE COMPOSITION AND PHOTOSENSITIVE RUBBER PLATE

TECHNICAL FIELD

The present invention relates to a photosensitive rubber plate and a photosensitive composition. More particularly, the present invention relates to a photosensitive rubber plate which is superior in transparency and strength balance and high in rate of washing with water after light exposure, as well as to a photosensitive composition used for obtaining the rubber plate.

BACKGROUND ART

Flexographic printing plates are produced by tightly fitting a negative film onto a photosensitive plate, applying an actinic ray thereto to expose part of the photosensitive layer of the plate to the ray, and washing and removing the unexposed portion of the photosensitive layer to form a relief. The solvent used for washing the unexposed portion is currently being converted from a conventional organic solvent into an aqueous solvent which is low in fear of environmental pollution.

The material for photosensitive layer of photosensitive rubber plate such as used in flexographic printing plate is required to have excellent transparency (which enables penetration of light to the interior of photosensitive layer), excellent balance between tight fittability onto material to be printed and strength of plate (the balance is hereinafter referred to as strength balance, in some cases) and high rate of washing with water (which enables easy formation of relief after light exposure).

As the material for photosensitive layer, there is known a photosensitive elastomer composition comprising a thermoplastic elastomer (e.g. styrene-butadiene block copolymer or styrene-isoprene block copolymer), a hydrophilic copolymer (these elastomer and copolymer are main components), a photopolymerizable ethylenically unsaturated monomer and a photopolymerization initiator.

Photosensitive rubber plates using the above photosensitive elastomer composition, however, are inferior in transparency and strength balance and low in rate of washing with water after light exposure.

DISCLOSURE OF THE INVENTION

The present invention has an object of providing a photosensitive rubber plate which is superior in transparency and strength balance and high in rate of washing with water after light exposure, and a photosensitive composition used for obtaining the rubber plate.

The present inventors made a study in order to achieve the above object and found out that a photosensitive rubber plate using a photosensitive composition comprising a hydrophilic copolymer and a styrene-butadiene-styrene type block copolymer having a high vinyl bond content in the conjugated diene monomer unit moiety, is superior in transparency and strength balance and high in rate of washing with water after light exposure. The present invention has been completed based on the above finding.

According to the present invention, there is provided a photosensitive composition comprising:
- 20–65 parts by weight of a block copolymer having at least one polymer block A consisting of a polymer containing 95% by weight or more of an aromatic vinyl monomer unit and at least one polymer block B consisting of a conjugated diene polymer containing 20% by weight or more of a conjugated diene monomer unit and having a vinyl bond content in the conjugated diene monomer unit moiety, of 15–70%,
- 35–80 parts by weight of a hydrophilic copolymer, the total amount of the block copolymer and the hydrophilic copolymer being 100 parts by weight,
- 5–300 parts by weight of a photopolymerizable ethylenically unsaturated monomer, and
- 0.1–10 parts by weight of a photopolymerization initiator.

According to the present invention, there is also provided a photosensitive rubber plate of laminated structure, comprising a substrate and a layer of the above photosensitive composition, formed on the main surface of the substrate.

BEST MODE FOR CARRYING OUT THE INVENTION

The present invention is described in detail below.

The photosensitive composition of the present invention comprises a block copolymer, a hydrophilic copolymer, a photopolymerizable ethylenically unsaturated monomer and a photopolymerization initiator.

The block copolymer, which is the first component of the present photosensitive composition, has a polymer block A consisting of a polymer containing an aromatic vinyl monomer as a main constituent unit and a polymer block B consisting of a conjugated diene polymer containing a conjugated diene monomer as an essential constituent unit and having a vinyl bond content in the conjugated diene monomer unit moiety, of 15–70%.

The polymer block A constituting the block copolymer consists of a polymer containing an aromatic vinyl monomer as a main constituent unit.

The aromatic vinyl monomer includes styrene, a-methyl styrene, o-methyl styrene, m-methylstyrene, p-methylstyrene, p-tert-butylstyrene, 1,3-dimethylstyrene, vinyltoluene, chlorostyrene, vinylnaphthalene, vinylanthracene, etc. Of these aromatic vinyl monomers, styrene is preferred.

The amount of the aromatic vinyl monomer constituting the polymer block A is 95% by weight or more, preferably 99% by weight or more based on the total monomer units constituting the polymer block A. The monomer(s) other than the aromatic vinyl monomer, constituting the polymer block A is (are) not particularly restricted.

The polymer block A has a weight-average molecular weight of generally 3,000–200,000, preferably 8,000–100,000. The polymer block A has a glass transition temperature of generally 25° C. or higher, preferably 50° C. or higher.

The polymer block B constituting the block copolymer consists of a polymer containing a conjugated diene monomer as an essential constituent unit. That is, the polymer block B consists of a homopolymer of a conjugated diene monomer, or a copolymer of a conjugated diene monomer and an ethylenically unsaturated monomer copolymerizable therewith.

The amount of the conjugated diene monomer constituting the polymer block B is 20% by weight or more, preferably 40% by weight or more, more preferably 70% by weight or more based on the total monomer units constituting the polymer block B. When the amount of the conjugated diene monomer is less than 20% by weight, the resulting photosensitive composition gives a photosensitive rubber plate of inferior strength balance.

The conjugated diene monomer includes 1,3-butadiene, isoprene, 2,3-dimethyl-1,3-butadiene, 1,3-pentadiene, 1,3- hexadiene, chloroprene, etc. Of these conjugated diene monomers, butadiene and isoprene are preferred.

The ethylenically unsaturated monomer copolymerizable with the conjugated diene monomer includes aromatic vinyl monomers such as styrene, o-methylstyrene, m-methylstyrene, p-methylstyrene, p-tert-butylstyrene, 1,3-dimethylstyrene, vinyltoluene, chlorostyrene, vinylnaphthalene, vinylanthracene and the like; ethylenically unsaturated carboxylic acid ester monomers such as methyl acrylate, ethyl acrylate, propyl acrylate, n-amyl acrylate, isoamyl acrylate, hexyl acrylate, ethylhexyl acrylate, octyl acrylate, hydroxyethyl acrylate, hydroxypropyl acrylate, glycidyl acrylate, methyl methacrylate, ethyl methacrylate, propyl methacrylate, n-amyl methacrylate, isoamyl meth-acrylate, hexyl methacrylate, ethylhexyl methacrylate, octyl methacrylate, hydroxyethyl methacrylate, hydroxypropyl methacrylate, glycidyl methacrylate and the like; vinyl cyanide monomers such as methacrylonitrile, acrylonitrile and the like; ethylenically unsaturated glycidyl ethers such as allyl glycidyl ethers and the like; ethylenically unsaturated carboxylic acid amide monomers such as acrylamide, methacrylamide and the like; vinyl halides such as vinyl chloride and the like; vinyl carboxylates such as vinyl acetate and the like; ethylenically unsaturated monocarboxylic acids such as acrylic acid, methacrylic acid and the like; ethylenically unsaturated polycarboxylic acids such as maleic acid, fumaric acid, citraconic acid and the like; partial esters of ethylenically unsaturated polycarboxylic acids, such as monoethyl maleate, monomethyl itaconate and the like; and so forth. Of these ethylenically unsaturated monomers, preferred are aromatic vinyl monomers, particularly styrene.

The polymer block B has a vinyl bond content in conjugated diene monomer unit moiety, of 15–70%, preferably 25–55%. When the vinyl bond content is less than 15%, the resulting photosensitive composition gives a photosensitive rubber plate of low transparency, inferior strength balance and low rate of washing with water. When the vinyl bond content is more than 70%, the resulting photosensitive composition gives a photosensitive rubber plate of low strength.

The vinyl bond content is a proportion of the conjugated diene monomers contained in the polymer block B in the forms of 1,2-bond and 3,4-bond, of the conjugated diene monomers contained in the polymer block B in the forms of 1,2-bond, 3,4-bond and 1,4-bond. The vinyl bond content is a value obtained by the use of an nuclear magnetic resonance apparatus.

The polymer block B has a weight-average molecular weight of generally 5,000–500,000, preferably 10,000–300, 000. The polymer block B has a glass transition temperature of 10° C. or lower, preferably 0° C. or lower.

Incidentally, the glass transition temperature is a value obtained by subjecting, to TDC or the like, a polymer obtained by polymerizing a composition of the monomers constituting the polymer block A or B.

The weight ratio of the polymer block A and the polymer block B, i.e. (polymer block A) / (polymer block B) is generally 5/95 to 95/5, preferably 10/90 to 90/10, more preferably 15/85 to 75/25.

The block copolymer has a weight-average molecular weight of generally 8,000–2,000,000, preferably 18,000–1, 000,000.

Incidentally, in the present invention, a weight-average molecular weight is a value obtained by measurement by gel permeation chromatography (hereinafter abbreviated to GPC) and subsequent reduction to the molecular weight of standard polystyrene. The weight-average molecular weight of the polymer block A or B was obtained by measuring the weight-average molecular weight of the formed block copolymer every time when a new polymer block A or B was formed and by determining, in each step of polymer block formation, an increase in weight-average molecular weight.

The block copolymer, which is the first component of the photosensitive composition of the present invention, has no restriction as to the combination structure of the polymer block A and the polymer block B, and includes, for example, those copolymers represented by general formulas $(A-B)_n$-A, $(A-B)_n$-A-B, B-$(A-B)_n$-A-B, $(A-B)_m$-X, $((A-B)_n$-A$)_m$-X, (B-A-$(B-A)_n)_m$-X and (B-A-$(B-A)_n$-B$)_m$-X wherein A is a polymer block A; B is a polymer block B; X is a residue of a coupling agent or a polyfunctional ionic polymerization initiator; n is an integer of 1 or more, preferably 1–5; m is an integer of 2 or more, preferably 2–5; the coupling agent includes tin tetrachloride, silicon tetrachloride, an epoxidized ester, a polyvinyl compound, a carboxylic acid ester, a polyhalogenated hydrocarbon, etc.; and the polyfunctional ionic polymerization initiator includes a polyfunctional organolithium compound, etc.). Of these, a block copolymer represented by a general formula A-B-A is preferred.

The block copolymer used in the present invention can be obtained generally by polymerizing the above-mentioned monomers using a polymerization initiator such as organolithium compound or the like. The block copolymer can be obtained specifically, for example, by polymerizing a monomer mixture containing an aromatic vinyl monomer as a main component, to form a polymer block A, adding and polymerizing a monomer mixture containing a conjugated diene monomer as an essential component, to form a polymer block B bonding to the molecular end of the polymer block A, and further adding and polymerizing the aromatic vinyl monomer to form another polymer block A bonding to the polymer block B, or by forming a polymer block A and a polymer block B bonding thereto in the same manner as mentioned above, and then adding a coupling agent.

There is no restriction as to the method for controlling the vinyl bond content in the polymer block B. The vinyl bond content is controlled generally by controlling, in production of the polymer block B, the amount or kind of the polar compound used, the polymerization temperature, etc.

The amount of the block copolymer in the photosensitive composition of the present invention is 20–65 parts by weight, preferably 25–55 parts by weight, more preferably 30–45 parts by weight with a proviso that the total amount of the block copolymer and the hydrophilic copolymer (described later) must be 100 parts by weight. When the amount of the block copolymer is more than 65 parts by weight, the resulting photosensitive composition gives a photosensitive rubber plate of low rate of washing with water. When the amount is less than 20 parts by weight, the resulting photosensitive composition has low processability and gives a photosensitive rubber plate of low aqueous ink resistance.

The hydrophilic copolymer, which is the second component of the photosensitive composition of the present invention, has, as a pendant in the molecular chain, a hydrophilic group such as —OH group, —COOH group, —CN group, —$NH_2$ group, —$SO_3H$ group, —$SO_2H$ group, —PO(OH)$_2$ group, —PO(OH)—group or the like, preferably a phosphoric acid ester group such as —PO(OH)$_2$ group,—PO(OH)—group or the like.

The hydrophilic copolymer is obtained generally by radical-copolymerizing an ethylenically unsaturated monomer having the above-mentioned hydrophilic group and a monomer copolymerizable therewith.

The hydrophilic group-containing ethylenically unsaturated monomer includes ethylenically unsaturated monocarboxylic acids such as acrylic acid, methacrylic acid and the like; ethylenically unsaturated polycarboxylic boxylic acids such as maleic acid, fumaric acid, citraconic acid, itaconic acid and the like; partial esters of ethylenically unsaturated polycarboxylic acids, such as monoethyl maleate, monomethyl itaconate and the like; hydroxyethyl acrylate, hydroxypropyl acrylate, hydroxyethyl methacrylate, hydroxypropyl methacrylate; vinyl cyanide monomers such as methacrylonitrile, acrylonitrile and the like; phosphoric acid ester group-containing ethylenically unsaturated monomers such as 2-acryloxyethyl phosphate, 3-acryloxy-propyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate, bis(polyethylene glycol acrylate) phosphate, methacrylates corresponding thereto, and the like; and so forth. Of these hydrophilic group-containing ethylenically unsaturated monomers, there are preferred phosphoric acid ester group-containing ethylenically unsaturated monomers, particularly, 2-acryloxyethyl phosphate, 3-acryloxypropyl phosphate, bis(2-acryloxy-ethyl) phosphate, bis(3-acryloxypropyl) phosphate and methacrylates corresponding thereto.

The amount of the hydrophilic group-containing ethylenically unsaturated monomer is generally 5–30% by weight, preferably 5–20% by weight of the total monomers used for obtaining the hydrophilic copolymer. When the amount of the hydrophilic group-containing ethylenically unsaturated monomer is less than 5% by weight, the resulting photosensitive composition tends to give a photosensitive rubber plate of low rate of washing with water. When the amount is more than 30% by weight, the resulting photosensitive composition tends to have low processability and give a photosensitive rubber plate of low aqueous ink resistance.

The monomer copolymerizable with the hydrophilic group-containing ethylenically unsaturated monomer includes aromatic vinyl monomers such as styrene, o-methylstyrene, m-methylstyrene, p-methylstyrene, p-tert-butylstyrene, 1,3-dimethylstyrene, vinyltoluene, chlorostyrene, vinylnaphthalene, vinylanthracene, divinylbenzene, trivinylbenzene and the like; ethylenically unsaturated carboxylic acid ester monomers such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethyl hexyl methacrylate, octyl methacrylate, glycidyl methacrylate, ethylene glycol diacrylate, trimethylolpropane triacrylate, propylene glycol diacrylate and the like; ethylenically unsaturated glycidyl ethers such as allyl glycidyl ethers and the like; conjugated diene monomers such as 1,3-butadiene, isoprene, chloroprene, 1,3-pentadiene and the like; and so forth.

Of these monomers copolymerizable with the hydrophilic group-containing monomer, there are preferred conjugated diene monomers, particularly 1,3-butadiene or isoprene so as to obtain a photosensitive rubber plate of improved strength balance. The amount of the conjugated diene monomer is generally 40–90% by weight, preferably 50–80% by weight of the total monomers used for obtaining the hydrophilic copolymer. When the amount of the conjugated diene monomer is less than 40% by weight, the resulting photosensitive composition gives a photosensitive rubber plate of low strength.

When the amount is more than 90% by weight, the resulting photosensitive composition gives a photosensitive rubber plate of low rate of washing with water.

Also, a polyfunctional ethylenically unsaturated monomer is used preferably so as to obtain a photosensitive composition of high processability and a photosensitive rubber plate of high transparency and strength. The polyfunctional ethylenically unsaturated monomer includes acrylic acid esters of polyalcohols, such as ethylene glycol diacrylate, trimethylolpropane triacrylate, propylene glycol diacrylate and the like, and methacrylic acid esters corresponding thereto; and polyfunctional vinyl monomers such as divinylbenzene, trivinylbenzene and the like. Of these polyfunctional ethylenically unsaturated monomers, ethylene glycol dimethacrylate or divinylbenzene is preferred. The amount of the polyfunctional ethylenically unsaturated monomer is generally 10% by weight or less of the total monomers used for obtaining the hydrophilic copolymer.

The hydrophilic copolymer used in the photosensitive composition of the present invention has a number-average molecular weight of generally 10,000–500,000, preferably 20,000–200,000 in order to obtain a photosensitive composition of improved processability and a photosensitive rubber plate of improved strength. Incidentally, the number-average molecular weight is a value obtained by measurement by GPC and subsequent reduction to the molecular weight of standard polystyrene.

The photopolymerizable ethylenically unsaturated monomer, which is the third component of the photosensitive composition of the present invention, includes aromatic vinyl monomers such as styrene, o-methylstyrene, m-methylstyrene, p-methylstyrene, p-tert-butylstyrene, 1,3-dimethylstyrene, vinyltoluene, chlorostyrene, vinylnaphthalene, vinylanthracene, divinylbenzene, trivinylbenzene and the like; ethylenically unsaturated nitrile monomers such as acrylonitrile, methacrylonitrile and the like; ethylenically unsaturated carboxylic acid ester:monomers such as methyl acrylate, ethyl acrylate, propyl acrylate, n-amyl acrylate, isoamyl acrylate, hexyl acrylate, ethylhexyl acrylate, octyl acrylate, glycidyl acrylate, methyl methacrylate, ethyl methacrylate, propyl methacrylate, n-amyl methacrylate, isoamyl methacrylate, hexyl methacrylate, ethylhexyl methacrylate, octyl methacrylate, hydroxyethyl acrylate, hydroxypropyl acrylate, hydroxyethyl methacrylate, hydroxypropyl methacrylate, glycidyl methacrylate, ethylene glycol diacrylate, trimethylolpropane triacrylate, 1,4-butanediol diacrylate, 1,4-butanediol dimethacrylate, propylene glycol diacrylate, 1,6-hexanediol diacrylate, 1,6-hexanediol dimethacrylate, methoxyethylene glycol acrylate, methoxypropylene glycol methacrylate, methoxyethylene glycol methacrylate, methoxypropylene glycol acrylate, diethyl maleate, dimethyl itaconate and the like; ethylenically unsaturated glycidyl ethers such as allyl glycidyl ether and the like; conjugated diene monomers such as 1,3-butadiene, isoprene, chloroprene, 1,3-pentadiene and the like; ethylenically unsaturated monocarboxylic acids such as acrylic acid, methacrylic acid and the like; ethylenically unsaturated polycarboxylic acids such as maleic acid, fumaric acid, citraconic acid, itaconic acid and the like;

partial esters of ethylenically unsaturated polycarboxylic acids, such as monoethyl maleate, monomethyl itaconate and the like; phosphoric acid ester group-containing ethylenically unsaturated monomers such as 2-acryloxyethyl phosphate, 3-acryloxypropyl phosphate, 2-acryloxypropyl phosphate, 4-acryloxybutyl phosphate, bis(2-acryloxyethyl) phosphate, bis(3-acryloxypropyl) phosphate, bis(4-acryloxybutyl) phosphate, diethylene glycol acrylate phosphate, triethylene glycol acrylate phosphate, polyethylene glycol acrylate phosphate, bis(diethylene glycol acrylate) phosphate, bis(triethylene glycol acrylate) phosphate, bis (polyethylene glycol acrylate) phosphate, methacrylates corresponding thereto, and the like; and so forth. These photopolymerizable ethylenically unsaturated monomers can be used in appropriate combination. Of these photopolymerizable ethylenically unsaturated monomers, a diacrylate or a dimethacrylate is preferred.

The amount of the photopolymerizable ethylenically unsaturated monomer is 5–300 parts by weight, preferably 10–200 parts by weight per 100 parts by weight of the total of the block copolymer and the hydrophilic copolymer. When the amount of the photopolymerizable ethylenically unsaturated monomer is less than 5 parts by weight, the resulting photosensitive composition is not cured sufficiently by an actinic ray and, therefore, gives a photosensitive rubber plate of low strength. When the amount is more than 300 parts by weight, the resulting photosensitive composition gives a photosensitive rubber plate of low strength and solvent resistance.

The photopolymerization initiator, which is the fourth component of the photosensitive composition of the present invention, includes α-diketones such as diacetyl, benzyl and the like; acyloins such as benzoin, pivaloin and the like; acyloin ethers such as benzoin methyl ether, benzoin ethyl ether, benzoin isopropyl ether and the like; polynuclear quinones such as anthraquinone, 1,4-naphthoquinone and the like; and so forth.

The amount of the photopolymerization initiator is 0.1–10 parts by weight, preferably 0.5–5 parts by weight per 100 parts by weight of the total of the block copolymer and the hydrophilic copolymer. When the amount of the photopolymerization initiator is less than 0.1 part by weight, the resulting photosensitive composition is not sufficiently cured by an actinic ray and, therefore, gives a photosensitive rubber plate of low strength. When the amount is more than 10 parts by weight, the resulting photosensitive composition is low in photopolymerization rate.

The photosensitive composition of the present invention can comprise as necessary, besides the first to fourth components, a plasticizer; a storage stabilizer; an antiozonant; a random copolymer such as styrenebutadiene random copolymer, acrylonitrile-butadiene random copolymer, styrene-isoprene random copolymer, methyl methacrylate-butadiene random copolymer or the like; and a homopolymer such as polybutadiene, polyisoprene or the like.

The plasticizer is added to the present photosensitive composition so that the composition can have improved plasticity and the first to fourth components of the composition can be mixed and molded uniformly. The plasticizer includes hydrocarbon oils such as naphthenic oil, paraffinic oil and the like; a polystyrene having a molecular weight of 3,000 or less; a polyacrylate; a liquid 1,2-polybutadiene, a liquid 1,4-polybutadiene and terminal-modified products thereof; a liquid acrylonitrile-butadiene copolymer, a liquid styrene-butadiene copolymer and carboxylated products thereof; and so forth.

The storage stabilizer is added to the present photosensitive composition so that the composition can have increased storage stability. The storage stabilizer includes phenols such as hydroquinone, pyrogallol, p-methoxyphenol, t-butylcatechol, 2,6-di-t-butyl-p-cresol, benzoquinone and the like; quinones such as benzoquinone, p-toluquinone, p-xyloquinone and the like; amines such as phenyl-a-naphthylamine and the like; and so forth.

The photosensitive composition of the present invention is produced generally by kneading by the use of a kneader such as kneader, roll mill or the like.

The order of kneading is not particularly restricted. However, in order to obtain a uniform composition, it is preferred to knead the hydrophilic copolymer and the block copolymer, then add the photopolymerizable ethylenically unsaturated monomer and the photopolymerization initiator, and conduct kneading.

The photosensitive rubber plate of the present invention has a laminated structure comprising a substrate and a layer of the above-mentioned photosensitive composition formed on the main surface of the substrate.

The substrate generally consists of a flexible film or sheet and, as necessary, has a release layer or an undercoat layer made of an adhesive or a primer. The substrate includes, for example, flexible films such as polyethylene terephthalate film, polypropylene film, polyimide film and the like; and flexible sheets made of a polyethylene terephthal ate, a polypropylene, a polyimide or the like, having, on the back side, a composition of an elastomer such as natural rubber, synthetic rubber, soft vinyl chloride resin or the like.

The formation of a layer of the photosensitive composition on the main surface of the substrate can be conducted by employing a known method. It can be conducted, for example, by molding the photosensitive composition into a sheet shape by the use of a molding machine such as extruder, press, calender or the like and, thereafter or simultaneously therewith, adhering the sheet onto a substrate; or by dissolving the first to fourth components in a solvent such as chloroform, carbon tetrachloride, trichloroethane, methyl ethyl ketone, diethyl ketone, benzene, toluene, tetrahydrofuran or the like to prepare a photosensitive composition of a solution form, pouring the solution into a sheet-shaped frame and, after evaporating the solvent to form a sheet or simultaneously with the sheet formation, adhering the sheet onto a substrate.

In the photosensitive rubber plate of the present invention, it is preferable that a thin layer made of a non-adhesive water-soluble polymer is formed, as a cover layer, on the layer of the photosensitive composition.

Since the surface of the photosensitive composition layer is generally very adhesive, there may arise the following problem when an original film is directly placed thereon. That is, air bubbles come in between the photosensitive composition layer and the original film; this causes irregular refraction of actinic ray and makes insufficient the exposure and curing of photosensitive composition layer; consequently, the reproducibility of relief is reduced; moreover, the reutilization of original film is impossible because the original film strongly adheres to the surface of the photosensitive composition layer and its peeling from said surface without impairment is difficult. Formation of a thin layer made of a non-adhesive water-soluble polymer can solve the above problems.

On the photosensitive rubber plate of the present invention can be further placed a cover film. The cover film consists of a flexible resin film. The cover film forms a protector film layer on the photosensitive composition layer (when a thin layer of water-soluble polymer is formed, on the thin layer). The cover film may have a release layer on the surface coming in contact with the photosensitive composition layer. The cover film includes a polyethylene terephthalate film, a polyethylene film, a polypropylene film, a polystyrene film, etc.

The film has a thickness of generally 75–200 μm, preferably 100–150 μm. When the thickness is smaller than 75 μm, the film has insufficient strength and the resulting photosensitive rubber plate is deformed easily. When the thickness is larger than 200 μm, the film has too high strength and the peeling of film from photosensitive composition layer is difficult.

On the photosensitive rubber plate of the present invention may be laminated a foamed material on the substrate side opposite to the photosensitive composition layer side. This lamination of a foamed material enables control of the printing pressure applied during flexographic printing.

The photosensitive rubber plate of the present invention is superior in washability with water and makes easy the formation of relief with aqueous developer. The aqueous developer is generally composed of water, an alcohol, an aqueous solution or an alcholic solution. The aqueous solution includes, for example, an aqueous alkaline solution containing an alkali metal salt, an alkaline earth metal salt or the like, and an aqueous solution containing a surfactant or the like. Of these aqueous developers, an aqueous solution containing a surfactant is preferred.

Next, the present invention is described in more detail by way of Examples. However, the present invention is in no way restricted by these Examples. In the Examples and Comparative Examples, parts and % are by weight unless otherwise specified.

Evaluation of photosensitive compositions and photosensitive rubber plates was conducted according to the following test methods.

[Washability with Water]

A photosensitive rubber plate was cut into a small test piece of 30 mm×30 mm. The test piece was washed with an aqueous solution of 50° C. containing 2% of a polyoxyethylene nonyl phenyl ether by the use of a wash-out machine for photosensitive flexographic plate (JOW-$A_2$-SS, a product of Nihon Denshi Seiki K.K. ). At that time, a time in which the thickness of the test piece reached 2 mm, was measured, and the washability with water of the photosensitive rubber-plate was expressed according to the following standard.

A: less than 8 minutes.
B: 8 minutes to less than 11 minutes.
C: 11 minutes to less than 14 minutes.
D: 14 minutes and more.
A indicates the best washability; and B, C and
D are inferior to A in this order (D is worst).

[Transparency]

A photosensitive rubber plate was cut into a small test piece of 30 mm×30 mm. The test piece was measured for transmission density by the use of a Machbeth transmission densitometer. A smaller value indicates higher transparency.

[Reproducibility of Relief Image]

One side of a photosensitive rubber plate was exposed to an ultraviolet light by the use of an ultraviolet exposure unit for plate making (JE-$A_2$-SS, a product of Nihon Denshi Seiki K. K. ) so that the thickness of the cured layer became about 1.5 mm. Then, the polyester film of the unexposed side of the photosensitive rubber plate was peeled; a negative film for reproducibility evaluation was adhered on said side; and the side was exposed to an ultraviolet light for 15 minutes by the use of the above ultraviolet exposure unit. The negative film was removed and the unexposed portion was dissolved and removed by the use of an aqueous solution of 50° C. containing 2% of a polyoxyethylene nonyl phenyl ether. Thereafter, drying was conducted at 70° C. for 20 minutes, and the unexposed portion-removed side was exposed again to an ultraviolet light for 10 minutes by the use of the above ultraviolet exposure unit to form a relief image for reproducibility evaluation.

The relief image was observed by the use of a microscope of 50-magnification and evaluated according to the following standard.

(1) Reproducibility of convex fine line

There was measured the minimum width of reproduced fine line which was reproduced at the same width as in the negative film without deformation or enlargement. A smaller value indicates superior reproducibility of convex fine line.

(2) Reproducibility of 0.7 mm-width reverse fine line

The groove depth of 0.7 mm-width reverse fine line was measured. A larger value indicates superior reproducibility of reverse fine line.

[Strength Balance]

The flat area of the rubber printing plate after evaluation of reproducibility of relief image was measured for tensile product (a product of tensile strength and elongation at break) under the conditions of tensile speed =500 mm/min and distance between bench marks =20 mm, according to JIS K 6301 (tensile test method). A larger tensile product indicates superior strength balance.

Reference Example 1

[Production of Block Copolymer (1)]

Into a stainless steel-made reaction vessel provided with a stirrer, which had been purged with nitrogen, were fed 2,300 parts of dehydrated purified cyclohexane, 0.4 part of tetramethylethylenediamine and 0.8 part of n-butyllithium. Then, 100 parts of styrene was added and polymerization was conducted at 70° C. for 1 hour. Thereafter, 800 parts of 1,3-butadiene was added in 1 hour with the reaction vessel inside being kept at 70° C. After the completion of the addition, polymerization was conducted for 30 minutes. Next, 100 parts of styrene was added; polymerization was conducted at 70° C. for 1 hour; and finally 0.05 part of methanol was added to obtain a block copolymer solution.

To the solution were added 5 parts of 2,6-di-tert-butyl-4-methylphenol and 5 parts of tris(nonyl phenyl) phosphate; the solvent was removed by steam coagulation; water was removed by the use of a vacuum drier to obtain a block copolymer (1).

Reference Example 2

[Production of Block Copolymer (2)]

Into a stainless steel-made reaction vessel provided with a stirrer, which had been purged with nitrogen, were fed 2,300 parts of dehydrated purified cyclohexane, 0.75 part of tetramethylethylenediamine and 1.21 parts of n-butyllithium. Then, 200 parts of styrene was added and polymerization was conducted at 70° C. for 1 hour. Thereafter, 800 parts of 1,3-butadiene was added in 1 hour with the reaction vessel inside being kept at 70° C. After the completion of the addition, polymerization was conducted for 30 minutes. Next, 1.6 parts of paradibromobenzene was added; polymerization was conducted at 70° C. for 2 hours; and finally 0.08 part of methanol was added to obtain a block copolymer solution. To the solution were added 5 parts of 2,6-di-tert-butyl-4-methylphenol and 5 parts of tris(nonyl phenyl) phosphate; the solvent was removed by steam coagulation; water was removed by the use of a vacuum drier to obtain a block copolymer (2).

Reference Example 3
[Production of Block Copolymer (3)]

A block copolymer (3) was obtained in the same manner as in Reference Example 1 except that the amount of tetramethylethylenediamine was changed to 0.92 part.

Reference Example 4
[Production of block copolymer (4)]

A block copolymer (4) was obtained in the same manner as in Reference Example 1 except that the amount of tetramethylethylenediamine was changed to 0.22 part.

Reference Example 5
[Production of Block Copolymer (5)]

A block copolymer (5) was obtained in the same manner as in Reference Example 1 except that no tetramethylethylenediamine was used.

The styrene content, butadiene content, vinyl bond content in butadiene block and weight-average molecular weight of each of the block copolymers (1) to (5) are shown in Table 1.

Reference Example 6
[Production of Hydrophilic Copolymer]

200 parts of water was fed into an autoclave. Thereto were added 60 parts of butadiene, 9 parts of methyl acrylate, 20 parts of 2-methacryloxyethyl phosphate, 10 parts of styrene, 1 part of divinylbenzene, 4 parts of sodium dodecylbenzenesulfonate, 0.3 part of potassium persulfate and 0.4 part of t-dodecylmercaptan. The resulting mixture was heated to 50° C. to initiate polymerization; when the conversion of polymerization reached 95%, a terminator was added to stop the reaction; and the reaction system was water-cooled to obtain a polymer emulsion. The emulsion was added to an aqueous solution containing 0.7% of N-mono(polyoxyethylene)-dodecylamine, to give rise to coagulation. The resulting crumbs were separated, water-washed, dehydrated, and vacuum-dried at 60° C. to obtain a hydrophilic copolymer having a number-average molecular weight of 100,000.

TABLE 1

| | Block copolymers | | | | |
|---|---|---|---|---|---|
| | (1) | (2) | (3) | (4) | (5) |
| Structure of block copolymer [Block A = polystyrene] | ABA | (AB)$_2$X | ABA | ABA | ABA |
| Block A content (%) | 19.8 | 20.3 | 20.4 | 20.0 | 20.2 |
| Block A molecular weight[*2] | 1.1 | 1.2 | 1.2 | 1.1 | 1.1 |
| [Block B = polybutadiene] | | | | | |
| Block B content (%) | 80.2 | 79.7 | 79.6 | 80.0 | 79.8 |
| Vinyl bond content[*1] (%) | 30.2 | 31.0 | 52.0 | 20.6 | 10.3 |
| Block B molecular weight[*2] | 11.3 | 6.4 | 11.8 | 11.7 | 11.4 |
| Weight-average molecular weight[*2] | 13.4 | 15.0 | 14.2 | 14.1 | 13.7 |
| Styrene content (%) | 19.8 | 20.3 | 20.4 | 20.0 | 20.2 |
| Coupling ratio (%) | — | 80.0 | — | — | — |

[*1]: Vinyl bond content in polybutadiene block and measured by the use of $H^1$-NMR of 500 MHz.
[*2]: Polystyrene-reduced weight-average molecular weight ($\times 10^4$) as measured by GPC. Block A molecular weight is an average of two As present at both sides of B.

EXAMPLE 1

65 parts of the hydrophilic copolymer obtained in Reference Example 6, 35 parts of the block copolymer (1), 50 parts of a liquid polybutadiene (Nisso PB B1000, a product of Nihon Soda Co., Ltd.) and 0.2 part of 2,6-di-t-butyl-p-cresol were kneaded at 150° C. by the use of a kneader until the mixture became uniform. Then, the kneader temperature was lowered to 120° C.; there were added 10 parts of 1,6-hexanediol diacrylate, 5 parts of 1,6-hexanediol dimethacrylate, 1 part of benzoin methyl ether and 0.02 part of methylhydroquinone; and the mixture was kneaded to obtain a photosensitive composition.

The photosensitive composition was placed in a frame mold having a spacer thickness of 3.0 mm, whose upper and lower sides were open. The upper and lower open sides of the mold were covered with a polyester film of 0.1 mm in thickness. The resulting mold was pressurized at 110–130° C. at 150 kgf by the use of a press and then cooled to obtain a photosensitive rubber plate having a total thickness of 3.0 mm. The evaluation results of this photosensitive rubber plate are shown in Table 2.

TABLE 2

| | Examples | | | | | Comparative Examples | |
|---|---|---|---|---|---|---|---|
| | 1 | 2 | 3 | 4 | 5 | 1 | 2 |
| Block copolymer (1) | 35 | | | | 50 | | 70 |
| Block copolymer (2) | | 35 | | | | | |
| Block copolymer (3) | | | 35 | | | | |
| Block copolymer (4) | | | | 35 | | | |
| Block copolymer (5) | | | | | | 35 | |
| Hydrophilic copolymer | 65 | 65 | 65 | 65 | 50 | 65 | 30 |
| Washability with water | A | A | A | B | B | C | D |
| Transparency | 1.29 | 1.30 | 1.32 | 1.33 | 1.34 | 1.48 | 1.54 |
| Reproducibility of convex fine line (mm) | 0.14 | 0.16 | 0.15 | 0.20 | 0.20 | 0.21 | — |
| Reproducibility of reverse fine line (μm) | 180 | 160 | 170 | 160 | 170 | 130 | — |
| Strength balance | 7600 | 7500 | 7300 | 7000 | 9200 | 5200 | — |

In Comparative Example 2, since the washability with water and transparency were very low, no evaluation was made for the reproducibility of image and strength balance.

EXAMPLES 2–5 AND COMPARATIVE EXAMPLES 1–21

Photosensitive compositions and photosensitive rubber plates were obtained in the same manner as in Example 1 except that the hydrophilic copolymer or block copolymer used in Example 1 was changed to the recipes shown in Table 2. The evaluation results of these photosensitive rubber plates are shown in Table 2.

As is clear from the above, the composition of Comparative Example 1 using a styrene-butadiene-styrene block copolymer having a vinyl bond content of 10.3% is inferior in washability with water and low in strength balance and image reproducibility. The composition of Comparative Example 2 using 70% by weight of a styrene-butadiene-styrene block copolymer is very low in washability with water.

Meanwhile, the photosensitive compositions of the present invention each using a styrene-butadiene-styrene block copolymer having a vinyl bond content of 15–70% are superior in transparency, strength balance, image reproducibility and washability with water.

In particular, the photosensitive compositions of the present invention each using a styrene-butadiene-styrene block copolymer having a vinyl bond content of 20–55% are superior in all of transparency, strength balance, image reproducibility and washability with water.

Industrial Applicability

The photosensitive composition of the present invention is superior in transparency and strength balance and high in rate of washing with water after photosensitization and, therefore, can be preferably used in production of flexographic printing plate which comprises adhering a negative film on the photosensitive composition, applying a light on the film, and washing and removing the unexposed portion of the composition to form a relief. Moreover, the unexposed portion of the present photosensitive composition is washable and removable with an aqueous solvent and, therefore, the waste after washing is easily disposable and has a small fear of environmental pollution.

We claim:

1. A photosensitive composition comprising:
   20–65 parts by weight of a block copolymer having
     at least one polymer block A consisting of a polymer containing 95% by weight or more of an aromatic vinyl monomer unit and
     at least one polymer block B consisting of a conjugated diene polymer containing 20% by weight or more of a conjugated diene monomer unit and having a vinyl bond content in the conjugated diene monomer unit, of 15–70% by weight,
   35–80 parts by weight of a hydrophilic copolymer, the total amount of the block copolymer and the hydrophilic copolymer being 100 parts by weight,
   5–300 parts by weight of a photopolymerizable ethylenically unsaturated monomer, and
   0.1–10 parts by weight of a photopolymerization initiator.

2. A photosensitive composition according to claim 1, wherein the block copolymer is composed of the polymer block A and the polymer block B of a weight ratio of 5/95 to 95/5.

3. A photosensitive composition according to claim 1, wherein the block copolymer has a weight-average molecular weight of 8,000–2,000,000.

4. A photosensitive composition according to claim 1, wherein the block copolymer is composed of a polystyrene block A and a polybutadiene block B or a polyisoprene block B.

5. A photosensitive composition according to claim 1, wherein the block copolymer has a block structure represented by a general formula A-B-A.

6. A photosensitive composition according to claim 1, wherein the block copolymer is composed of a polystyrene block A and a polybutadiene block B, is represented by a general formula A-B-A, has a (polymer block A)/(polymer block B) weight ratio of 5/95 to 95/5, and has a weight-average molecular weight of 8,000–2,000,000.

7. A photosensitive composition according to claim 1, wherein the hydrophilic copolymer contains a phosphoric acid ester group.

8. A photosensitive composition according to claim 1, wherein the hydrophilic copolymer is obtained by copolymerizing 5–30% by weight of a phosphoric acid ester group-containing ethylenically unsaturated monomer, 40–90% by weight of a conjugated diene monomer, 0–10% by weight of a polyfunctional ethylenically unsaturated monomer and 0–55% by weight of a monomer copolymerizable with the above monomers.

9. A photosensitive composition according to claim 1, wherein the hydrophilic copolymer has a weight-average molecular weight of 10,000–500,000.

10. A photosensitive composition according to claim 1, wherein the hydrophilic copolymer is obtained by copolymerizing 5–30% by weight of a phosphoric acid ester group-containing ethylenically unsaturated monomer, 40–90% by weight of a conjugated diene monomer, 0–10% by weight of a polyfunctional ethylenically unsaturated monomer and 0–55% by weight of a monomer copolymerizable with the above monomers and has a number-average molecular weight of 10,000–500,000.

11. A photosensitive composition according to claim 1, wherein the photopolymerizable ethylenically unsaturated monomer is a diacrylate or a dimethacrylate.

12. A photosensitive rubber plate of laminated structure, comprising a substrate and a layer of a photosensitive composition of any of claim 1, formed on the main surface of the substrate.

13. A flexographic printing plate obtained by adhering a negative film on one side of a photosensitive rubber plate of claim 12, applying a light on the film, and removing the unexposed portion of the photosensitive rubber plate with an aqueous developer.

* * * * *